(12) United States Patent
Hansquine

(10) Patent No.: US 6,333,954 B1
(45) Date of Patent: Dec. 25, 2001

(54) HIGH-SPEED ACS FOR VITERBI DECODER IMPLEMENTATIONS

(75) Inventor: David Hansquine, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 09/422,920

(22) Filed: Oct. 21, 1999

(51) Int. Cl.⁷ .......................... H04L 27/06; H03M 13/03
(52) U.S. Cl. .......................... 375/341; 714/795
(58) Field of Search ................... 375/341, 262, 375/265; 714/794, 795, 796

(56) References Cited

U.S. PATENT DOCUMENTS

| | | | |
|---|---|---|---|
| 5,928,378 | * 7/1999 | Choi ........................... | 714/795 |
| 5,940,416 | 8/1999 | Nishiya et al. ............... | 371/43.7 |
| 6,097,769 | * 8/2000 | Sayiner et al. .............. | 375/341 |
| 6,148,431 | * 11/2000 | Lee et al. .................... | 714/794 |

FOREIGN PATENT DOCUMENTS 9848518    10/1998    (WO) ..................... H03M/13/00

* cited by examiner

*Primary Examiner*—Chi Pham
*Assistant Examiner*—Khai Tran
(74) *Attorney, Agent, or Firm*—Philip R. Wadsworth; Charles D. Brown; Howard H. Seo

(57) ABSTRACT

The present invention discloses a system and system of performing an add-compare-select butterfly operation in an implementation of the Viterbi algorithm. The system includes a first memory element for storing a plurality of source state metrics. The first memory element is coupled to a multiplexer which is capable of selecting between a first and second operating path based on even and odd clock cycles. The multiplexer is coupled to an add-compare-select mechanism, which calculates the target state metrics for each of the source state metrics. A second storage element, coupled to the add-compare-select mechanism and the multiplexer, is used to temporarily store the target state metrics while a third storage element stores a predetermined logic bit which corresponds to the lowest value target state metric. The multiplexer therefore selects the first operating path during even clock cycles and supplies the source state metrics from the first memory element to the add-compare-select mechanism to generate target state metrics. During odd clock cycles, the multiplexer selects the second operating path to access the second memory element and use the previously calculated target state metrics as intermediate source state metrics, such that the add-compare-select mechanism generates the target state metrics based on the intermediate source state metrics.

21 Claims, 7 Drawing Sheets

8 X 1 ACS BUTTERFLY ARRAY

8 X 1 MODIFIED ACS BUTTERFLY ARRAY

HIGH-SPEED ACS FOR VITERBI DECODER IMPLEMENTATIONS

BACKGROUND OF THE INVENTION

I. Field of the Invention

This invention generally relates to applications of the Viterbi algorithm. More particularly, the present invention relates to an improved system and method of performing a high-rate Add-Compare-Select (ACS) butterfly operation in an implementation of the Viterbi algorithm.

II. Description of Related Art

The Viterbi algorithm was first introduced in 1967 as a method for decoding convolutionally-encoded signals. Since its introduction, the algorithm has gained wide acceptance in the field of data communications, data recording, and digital signal processing. The algorithm has been used to successfully combat a variety of digital estimation issues, including the reduction of recording errors in storage media, the removal of intersymbol interference, and the enhancement of character and text recognition.

As such, the Viterbi algorithm has become the foremost method for the error-correction decoding of convolutionally-encoded data. For such applications, the Viterbi algorithm determines, based on a series of observations, the path with the smallest error metric that traverses a trellis typifying all possible encoder states. This shortest path exemplifies the mostly likely sequence generated by a convolutional encoder.

FIG. 1A illustrates a typical convolutional encoder. The convolutional encoder 100 comprises an 8-bit tapped shift register 110 and a pair of exclusive OR-type summers 120 that transform a sequence of input data bits U(D) 105 into a sequence of output code symbols $C_0(D)$, $C_1(D)$ 125. In particular, FIG. 1A demonstrates the example of a rate$_{13}$ code which generates two output coding symbols $C_0(D)$, $C_1(D)$ 125 for each input data bit U(D) 105. It is to be noted that the specific code rate and configuration of the convolutional encoder 100 shown is merely illustrative and in no way limits the operation or scope of the various embodiments of the invention. As such, different code rates, such as ⅓ or __, for example, could be used in conjunction with the embodiments of the invention.

Encoder 100 generates each output code symbol $C_0(D)$, $C_1(D)$ 125 by shifting and exclusive-OR summing the input bit stream U(D) 105 according to the particular shift-register configuration specified by generator code polynomials $G_0(D)$, $G_1(D)$. In this case, FIG. 1A depicts the shift-register interconnections that provide the rate $_{13}$ generator code polynomial $G_0(D)=1 \oplus D^2 \oplus D^4 \oplus D^7$. The coefficients of polynomial $G_0(D)$ are convolved with input data sequence U(D) 105 to generate output convolutional code symbol $C_0(D)$ 125. Similarly, FIG. 1A shows the rate $_{13}$ generator code polynomial $G_1(D)=1 \oplus D^2 \oplus D^5$, whose coefficients are convolved with input data sequence U(D) 105 to generate output convolutional code symbol $C_1(D)$ 125. The constraint length K of the encoder 100 is one more than the number of delay elements in shift register 110; for encoder 100, constraint length K equals 9. For each data bit 105 inputted into encoder 100, the output code symbols $C_0(D)$, $C_1(D)$ 125 depend on the inputted bit as well as the previous K−1 input bits. Therefore, the encoder 100 produces output code symbols $C_0(D)$, $C_1(D)$ 125 that are capable of spanning $2^{K-1}$ possible encoder states.

In a typical communication system, the output code symbols $C_0(D)$, $C_1(D)$ 125 are subsequently modulated and transmitted over a noisy channel (not shown). A decoder eventually receives the noisy convolutionally-encoded data stream and employs the Viterbi algorithm, which exploits the properties of convolutional codes to ultimately determine the input data sequence U(D) 105.

One advantage of convolutional codes is their highly repetitive structure, which provides for a symmetrical code tree. Theoretically, a convolutional code is capable of generating an infinite sequence of code symbols. However, because of its symmetry, the number of states that need to be evaluated in locating the most probable path leading to the inputted data sequence U(D) 105 is reduced to $2_{k-1}$ (in this case, 256) states. Moreover, in decoding such a symmetrical code, only the most probable (i.e surviving) local path into each of the 256 possible encoder states is of interest—all other paths maybe discarded from further consideration. This is because the most probable global path through a state must necessarily follow the surviving local path through that state.

The Viterbi decoder relies on these code properties to function as a finite state machine having a limited set of state transitions. The decoder hypothesizes each of the possible encoder $2^{k-1}$ states and determines the probability that the encoder transitioned from each of those states to the next set of $2^{k-1}$ possible encoder states, based on the observations obtained from the received noisy convolutionally-encoded data stream.

The transition probabilities are represented by quantities, referred to as metrics, which are proportional to the negative logarithm of the probability values. Clearly, the smaller the metric, the higher the probability of occurrence. There are two types of metrics: state metrics and branch metrics. The state metric, also called a path metric, represents the relative probability that the transmitted set of code symbols passed through a particular state. The branch metric represents the conditional probability that the transition from a particular source state to a particular target state was transmitted (assuming that the source state was correct).

The Viterbi algorithm may be summarized as follows: where time is divided into d samples and n possible states $S_i^k$ exist at each time sample k (where i is an integer from 1 to n and k is an integer from 1 to d). For k>1, each state may be reached by a path from any one of p precursor states $S_j^{k-1}$ (where j is an integer from 1 to p). For each state, the path with the minimum metric among these p possible paths is identified and stored, along with the value of that metric:

Initialization: for the starting time sample (k=1), the metric stored at each state $S_i^1$ is initialized. In the case where the starting state is known, the metric of this case may be set to zero while the metrics of the other states $S_i^1$ are set to a large number. This scheme forces later iterations of the algorithm to choose only paths originating from the desired starting state.

Iteration: for each time sample (k=2 to d), all of the states $S_i^k$ are visited. At each state $S_i^k$, the metric for each path j leading to that state is calculated as the sum of (a) the metric of the precursor state $S_j^{k-1}$ and (b) the metric $bm_j^k$ of the branch leading from state $S_j^{k-1}$ to state $S_i^k$. Of the p paths leading to each state $S_i^k$, the path with the lowest metric (i.e. the survivor path) is selected and stored at that state, and the metric for that path is also stored as the metric $sm_i^k$ for that state.

Chainback: when all of the states for the last time sample have been visited, the state $S_i^d$ having the lowest state metric is identified. The survivor path for this state is read from storage, and the corresponding state for time sample d−1 is thereby identified. The survivor path for this latter state is read from storage, and the chainback process is repeated until all of the states comprising the path leading to state $S_i^d$ (i.e. the most likely path through the state-time matrix) have been identified.

Thus, at any time k, the Viterbi algorithm calculates the metrics of the paths leading to states $S_n^k$, determines the survivor paths (one for each of the n states $S_n^k$), and stores the n survivor paths as well as their respective metrics. This is equivalent to storing, for every target state considered, the source state which leads to it. As such, any implementation of the Viterbi algorithm requires the use of an Add-Compare-Select (ACS) unit 150, as illustrated in FIG. 1B, to perform these operations. The ACS unit 150 is responsible for calculating the state metric values and also characterizes the relationships between the source and target states by virtue of ACS butterfly operations. FIG. 2 depicts a single ACS butterfly operation 155.

The butterfly operation 155 includes the only possible state transitions that could have occurred for two particular source states in encoder 100. This is partly due to the fact that, at any given time, the state of encoder 100 is the encoder's previous state right-shifted by 1 bit. The next (right-shifted) information bit determines which transition is made from a source state and will appear as the most significant bit (MSB) of the target state. As such, there are only two possible target states that a source state can transition to. Thus, as evidenced by FIG. 2, encoder 100 can only transition from source state "x0" to target state "0x" or "1x" and from source state "x1" to target state "0x" or "1x", depending on the value of the inputted data bit U(D). It is to be noted that notation "x0" and "x1" indicate that the least significant bit (LSB) of the source state is "0" and "1", respectively, while the upper bits are represented by "x"; and notation "0x" and "1x" indicate that the MSB of the target states are "0" or "1", respectively, while the lower bits are represented by "x". The term "x" represents the same value (e.g., 7 bit value) whether it is included in the source state or target state.

FIG. 2 also reveals that each transition from a source state to a target state generates a hypothesized set of code symbols $H_0(D)$, $H_1(D)$ or $\overline{H_0}(D)$, $\overline{H_1}(D)$,. In fact, when encoder 100 operates along the parallel branches of the ACS butterfly 155 (e.g., transitions from "x0" to "0x" or from "x1" to "1x") code symbols $H_0(D)$, $H_1(D)$ 125 are generated for both parallel branches. This feature is due in part to the repetitive nature of convolutional codes in general, as well as the use of generator code polynomials having their MSBs and LSBs set to unity (i.e., for both $G_0(D)$ and $G_1(D)$, $g_0$ and $g_8$ are equal to 1). In like fashion, code symbols $\overline{H_0}(D)$, $\overline{H_1}(D)$ are generated when encoder 100 operates along either of the diagonal branches of the ACS butterfly 155 (e.g., transitions from "x0" to "1x" or from "x1" to "0x").

As stated above, the ACS 150 unit calculates the target state metrics $tm_{0x}$, $tm_{1x}$. The ACS 150 logic stores the source state metrics $sm_{x0}$, $sm_{x1}$ which relate to the probability that a received set of code symbols leads to source states "x0" and "x1". Returning to FIG. 1B, upon receiving a set of code symbols, the Branch Metric Unit 140 computes the branch metric values $bm_{ij}$, $bm_{\overline{ij}}$. ACS 150 "adds" the branch metric $bm_{ij}$, $bm_{\overline{ij}}$ corresponding to each of the two transitions leading to a particular target state to the corresponding source state metric $sm_{x0}$, $sm_{x1}$. The branch metrics $bm_{ij}$, $bm_{\overline{ij}}$ represent the conditional probability that the transition from a particular source state to a particular target state occurred. Branch metric $bm_{ij}$ indicates how closely the received code symbols match the ACS 150 hypothesized code symbols $H_0(D)$, $H_1(D)$ 125, and branch metric $bm_{\overline{ij}}$ indicates how closely the received code symbols match $\overline{H_0}(D)$, $\overline{H_1}(D)$. The value of branch metrics $bm_{ij}$, $bm_{\overline{ij}}$ is dependent only upon the distance between the received symbol pair and the hypothesized symbol pair $H_0(D)$, $H_1(D)$.

For each of the two target states, the ACS 150 compares the sum of the source state metric-branch metric pairs leading to that target state. The most likely transition into each target state, represented by the smallest metric sum, is then "selected" by ACS 150 and assigned to that target state as the target state metric $tm_{0x}$, $tm_{1x}$.

As stated above, the ACS 150 logic adds the branch metric $bm_{ij}$, $bm_{\overline{ij}}$ to the source state metric $sm_{x0}$, $sm_{x1}$ for each of the two transitions leading to a target state and decides that the most likely path into that target state came from the transition that yields the smaller metric sum. The smaller metric sum is then selected and becomes the new target state metric $tm_{0x}$, $tm_{1x}$. The ACS 150 also stores the state metrics (i.e., the costs associated with the most likely path leading to each target state) into the state RAM 145. As indicated by FIG. 1B, the selection of the smallest metric sum results in the storing of a one-bit quantity, referred to as a decision bit, in the path memory of a chainback memory unit 160. The decision bit, which is indicated by the LSB of the winning source state metric, identifies which of the two transitions was selected.

The chainback memory unit 160 stores the decision bit corresponding to the most likely transition into each target state. For encoder 100 having a constraint length K=9, there will be $2_{K-1}$ or 256 decision bits generated which correspond to each of the 256 possible states of encoder 100. Once a matrix of all such information for a predetermined number of states is generated and stored, the chainback unit 160 starts at the state with the greatest likelihood of heading the correct path (i.e., the state among all those corresponding to the most recent time unit having the lowest cost). The chainback unit 160 then chains backward in time by reading through the last P×256 (i.e., P×2$^{K-1}$) decision bits to select P bits, where P is the effective chainback depth of the path memory. Since the decision bits represent the most likely set of bits hypothesized to have been passed through the encoder 100, they are the best data that can be outputted by the decoder. As a result, the further back in the decision history the chain goes, the better likelihood that the selected path merges with the correct path. Thus, the higher the chainback depth P, the better the performance but the higher the pipeline and storage delays. The chainback depth P is, therefore, generally set between 3 and 10 times the encoder 100 constraint length K. For a K=9 encoder, the chainback depth P is typically set at 64.

An ACS processing cycle defines the period in which the ACS unit 150 calculates new target state metrics $tm_{0x}$, $tm_{1x}$ for a predetermined number of received code symbols. For a_rate convolutional code, each pair of received code symbols requires 1 process cycle for metric calculations. The length of the process cycle equals the number of clock cycles required to perform the ACS butterfly operations for all encoder states for two sets of received symbols. For example, a Viterbi decoder having a single ACS butterfly, as depicted in FIG. 2, would generally require 128 clock cycles per received code symbol to perform the operations for all 256 states of encoder 100. To improve processing speed, ACS butterfly array architectures deploying multiple ACS butterflies can be used to reduce the number of clock cycles in one processing cycle.

An example of such an architecture is the 8×1 ACS butterfly array 300, illustrated in FIG. 3. Array 300 proffers an 8× improvement in processing speed by virtue of implementing 8 parallel ACS butterfly units 155 in parallel. For a set of received code symbols, the 8×1 butterfly array 300 uses all 8 butterfly units 155 to read 16 of the source states and calculate the 16 corresponding target state metrics $tm_{0X}$, $tm_{1X}$, within a single clock cycle. As stated above, the ACS unit 155 receives the state metric for each of the source states and branch metrics $bm_{ij}$, $bm_{\overline{ij}}$ for each of the four possible transitions. The branch metric $bm_{ij}$, $bm_{\overline{ij}}$ is dependent only upon the value of the received code symbol pair and the hypothesized symbol pair $H_0(D)$, $H_1(D)$ or $\overline{H_0}(D)$, $\overline{H_1}(D)$, and is a measurement of the distance between the two. The "X" included as part of the source and target states in FIG. 3 represents a four-bit place-holder (i.e, X=[X0, X1, X2, X3]) which chronicles through 16 clock cycles by counting from 0 through 15. Thus, for two sets of received code symbols, the 8×1 butterfly array 300 computes the target state metrics $tm_{0X}$, $tm_{1X}$, for all 256 possible states of encoder 100 in 32 clock cycles (i.e., 16 clock cycles for each received code symbol).

A drawback of the 8×1 butterfly array architecture 300 is that for each set of received code symbols, it needs to read 16 source state metrics and must simultaneously generate the required branch metrics for each of the 16 clock cycles. Thus the 8×1 butterfly array 300 requires an immense memory bandwidth to accommodate such operations.

Another example of the array architectures is the 4×2 ACS butterfly array 400, illustrated in FIG. 4. The 4×2 ACS butterfly array 400 boasts the same speed improvement as the 8×1 butterfly array 300, but does so by implementing 2 sets of 4 ACS butterfly 155 units in parallel. Butterfly array 400 mitigates the memory bandwidth issue by temporarily storing the intermediate target state metrics $tm_{0X}$, $tm_{1X}$. For example, within a single clock cycle, the first stage of array 400 reads the 8 source states and calculates the 8 corresponding target state metrics $tm_{0X}$, $tm_{1X}$. However, butterfly array 400 does not immediately store the intermediate target state metrics $tm_{0X}$, $tm_{1X}$. Instead, while still within the clock cycle, butterfly array 400 rearranges the intermediate target states to feed into the second stage, as source states, and subsequently calculates the 8 corresponding target state metrics $tm_{0X}$, $tm_{1X}$ for the next set of received code symbols. Thus, much like the 8×1 butterfly array 300, butterfly array 400 is capable of computing the target state metrics $tm_{0X}$, $tm_{1X}$ for two sets of received code symbols over a span of 32 clock cycles.

The 4×2 ACS butterfly array 400 has the distinct advantage of reducing the ACS 150 state memory bandwidth, since the intermediate target state metrics (i.e., first stage target metrics $tm_{0X}$, $tm_{1X}$) do not need to be read from, or written to, the ACS 150 state memory. Rather, the intermediate target state values flow combinatorially into the next stage, avoiding delays and minimizing bandwidth requirements.

However, the 4×2 ACS butterfly array 400 is not without its limitations. For example, the advantage of reducing the state memory bandwidth rests squarely on the fact that array 400 performs 2 stages of ACS 150 calculations within a single clock cycle. This critical path can be significantly limiting for higher clock speeds.

Moreover, for either the 8×1 ACS butterfly array 300 or the 4×2 ACS butterfly array 400, there exist performance issues with respect to the chainback operation. As stated above, the chainback unit 160 is responsible for storing the decision bits generated by the ACS array and for chaining back through the stored decision bits to generate the decoded decision bits.

For an encoder having a constraint length K=9 (e.g., encoder 100), the ACS array in the decoder will generate $2^{K-1}$ or 256 decision bits for each set of received code symbols (i.e., 1 decision bit for each of the 256 possible encoder states) and the chainback memory unit 160 will typically contain a chainback path memory depth of P=64 blocks.

After 32 process cycles, each of which computes the target state metrics for two sets of received symbols, the chainback unit 160 begins with the most recent process cycle (e.g., the rightmost memory block $B_0$ of the 64 path memory blocks), as shown in FIG. 5A. The chainback unit 160 identifies, from the 256 decision bits within chainback memory block $B_0$, the decision bit corresponding to the state with the lowest metric value $R_0$. This state is defined as the best state $BS_0$, and has an 8 bit address, as shown in FIG. 5B. The chainback unit 160 reads the best state decision bit value and then introduces the value into the $BS_0$, address by left-shifting it into the $BS_0$, least significant bit (i.e., $bs_0$), as shown in FIG. 5. FIG. 5B further illustrates that the values of the other bits in the $BS_0$ address (i.e., $bs_6$, $bs_5$, $bs_4$, $bs_3$, $bs_2$, $bs_1$) are also left-shifted, resulting in the loss of the $BS_0$, most significant bit (i.e., $bs_7$) and the manifestation of a new address $BS_1$. As depicted in FIG. 5A, $BS_1$, is the address of the best state value $R_1$ in chainback memory block $B_1$. The chainback unit 160 then reads the decision bit value corresponding to the $BS_1$, address and left-shifts that value into the $BS_1$, address to generate the next address $BS_2$, which corresponds to the best state of chainback memory block $B_2$.

This read and left-shift operation is repeated until all chainback memory blocks (i.e., P=64 blocks) have been processed. Generally, the chainback operation performs as many reads as the defined chainback length P, so that in this case, for example, 64 reads are performed to trace back the desired path and generate the decoded decision bits. This many reads, however, may compromise the efficiency and performance of the decoding process.

What is needed, therefore, is a system and method that is capable of efficiently performing high-rate ACS butterfly operations in a Viterbi algorithm implementation.

SUMMARY OF THE INVENTION

Systems and methods consistent with the principles of the present invention address the need identified above by providing a system and method that performs high-rate ACS butterfly operations in an implementation of the Viterbi algorithm.

A system and method, consistent with the principles of the present invention as embodied and broadly described herein, includes a first memory element for storing a plurality of source state metrics. The first memory element is coupled to a multiplexer which is capable of selecting between a first and second operating path based on even and odd clock cycles. The multiplexer is coupled to an add-compare-select mechanism, which calculates the target state metrics for each of the source state metrics. second storage element, coupled to the add-compare-select mechanism and the multiplexer, is used to temporarily store the target state metrics while a third storage element stores a predetermined logic bit which corresponds to the source state resulting in the lowest value target state metric. The multiplexer, therefore, selects the first operating path during even clock cycles and supplies the source state metrics from the first memory element to the add-compare-select mechanism to generate target state metrics. During odd clock cycles, the multiplexer selects the second operating path to access the second memory element and use the previously calculated target state metrics as intermediate source state metrics, such that the add-compare-select mechanism generates the target state metrics based on the intermediate source state metrics.

BRIEF DESCRIPTION OF THE DRAWINGS

The accompanying drawings, which are incorporated in and constitute a part of this Specification, illustrate an embodiment of the invention and, together with the description, explain the objects, advantages, and principles of the invention. In the drawings.

DETAILED DESCRIPTION OF THE PREFERRED EMBODIMENTS

The following detailed description of the present invention refers to the accompanying drawings that illustrate preferred embodiments consistent with this invention. Other embodiments are possible and modifications maybe made to the embodiments without departing from the spirit and scope of the invention. Therefore, the following detailed description is not meant to limit the invention. Rather the scope of the invention is defined by the appended claims.

It will be apparent to one of ordinary skill in the art that the present invention as described below may be implemented in many different embodiments of software, firmware, and hardware in the entities illustrated in the figures. The actual software code or specialized control hardware used to implement the present invention is not limiting of the present invention. Thus, the operation and behavior of the present invention will be described without specific reference to the actual software code or specialized hardware components, it being understood that a person of ordinary skill in the art would be able to design software and control hardware to implement the preferred embodiment of the present invention based on the description herein.

Figure 1A:
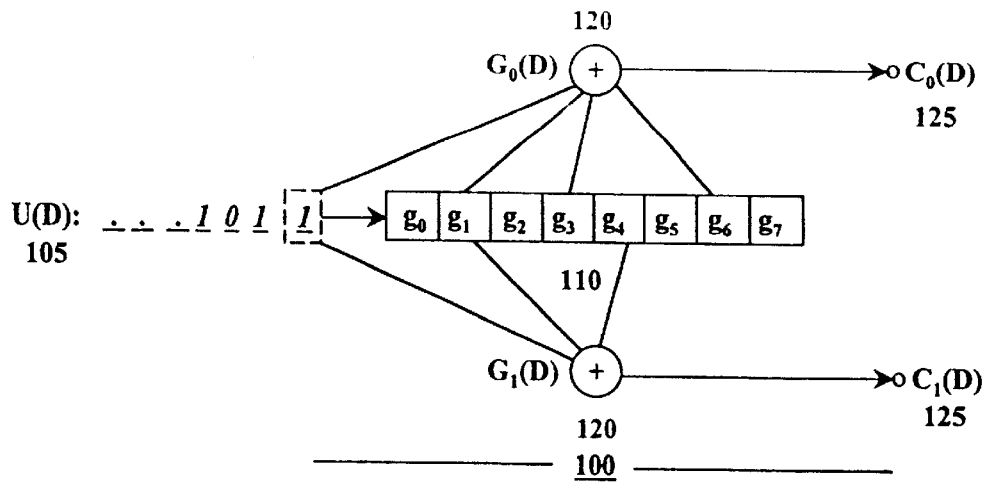
FIG. 1A is a block level diagram illustrating a K=9, rate =_convolutional encoder.
Figure 1B:
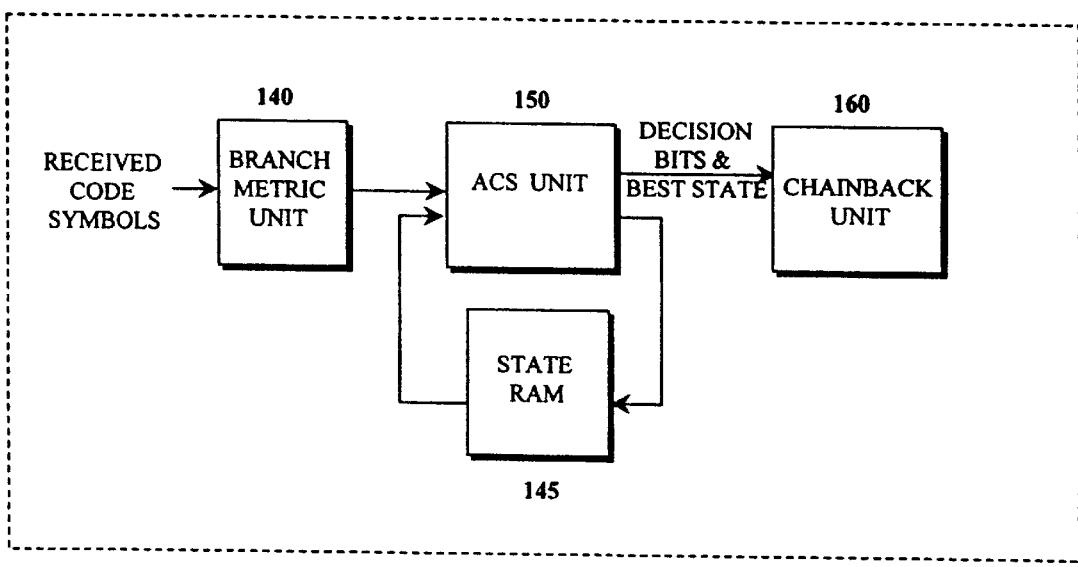
FIG. 1B is a system level block diagram depicting an ACS and chainback unit
Figure 2:
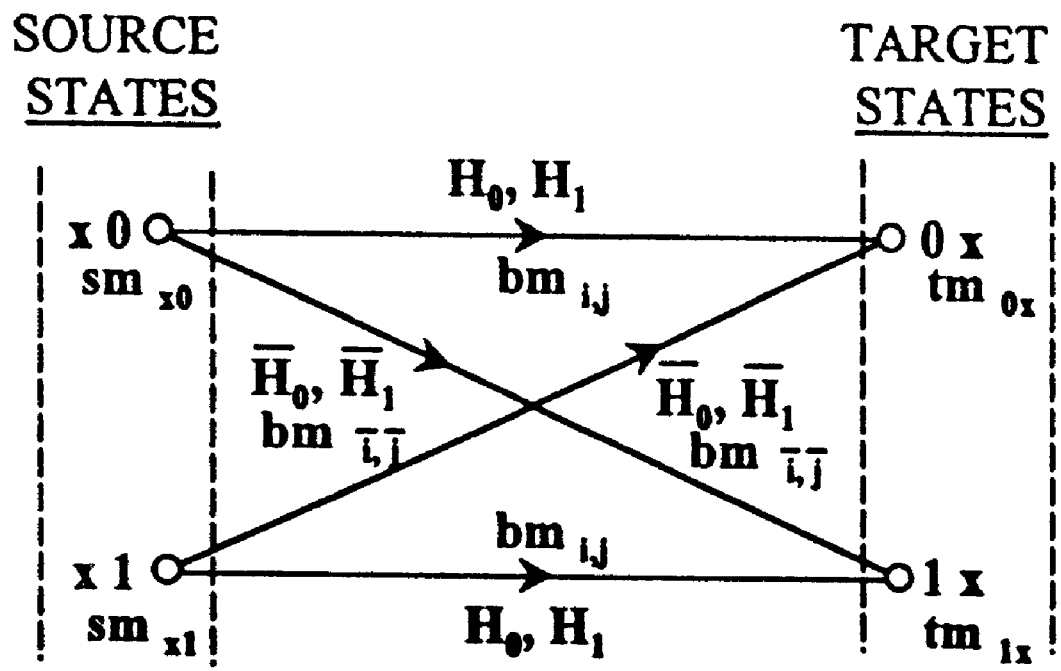
FIG. 2 is a transition diagram illustrating the ACS butterfly operation.
Figure 3:
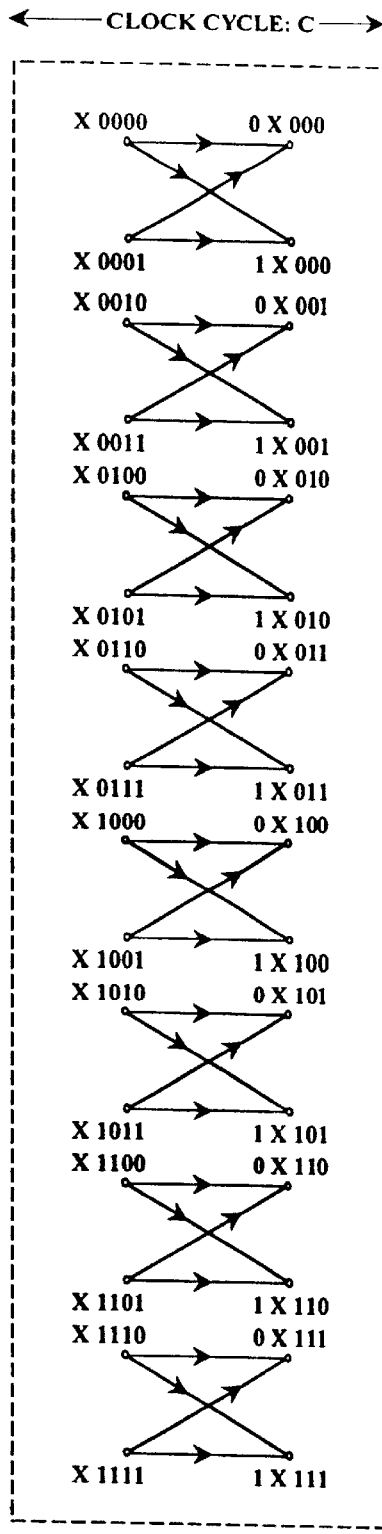
FIG. 3 is a transition diagram depicting an 8×1 ACS butterfly array.
Figure 4:
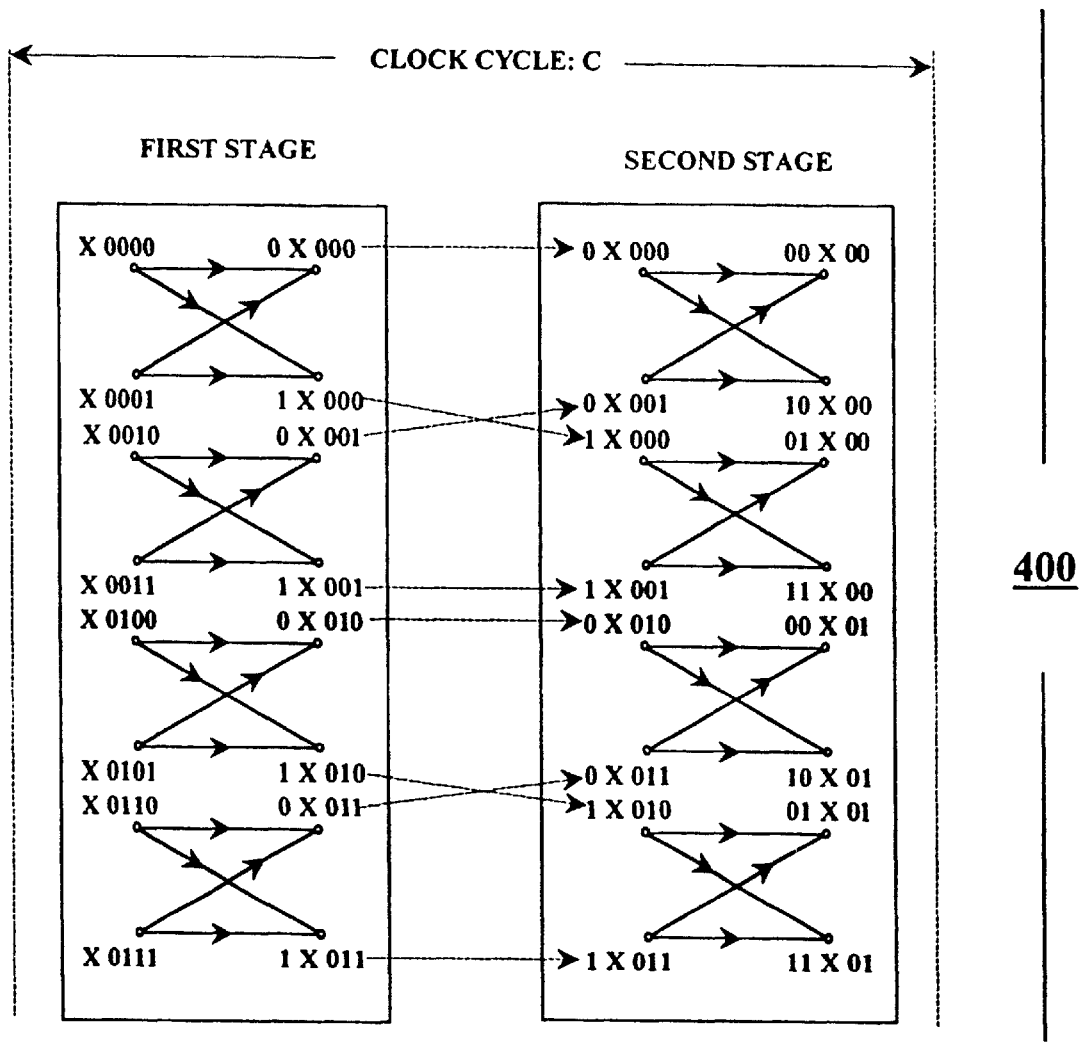
FIG. 4 is a transition diagram depicting an 4×2 ACS butterfly array.
Figure 5A:
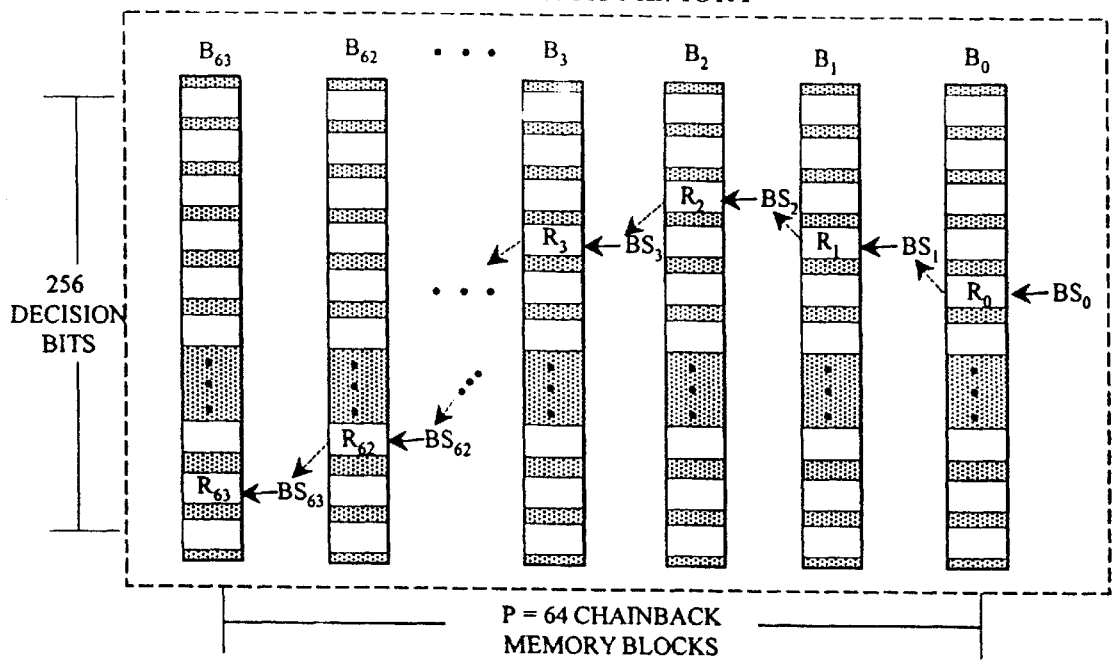
FIGS. 5A, 5B are functional block diagrams depicting a chainback operation.
Figure 5B:
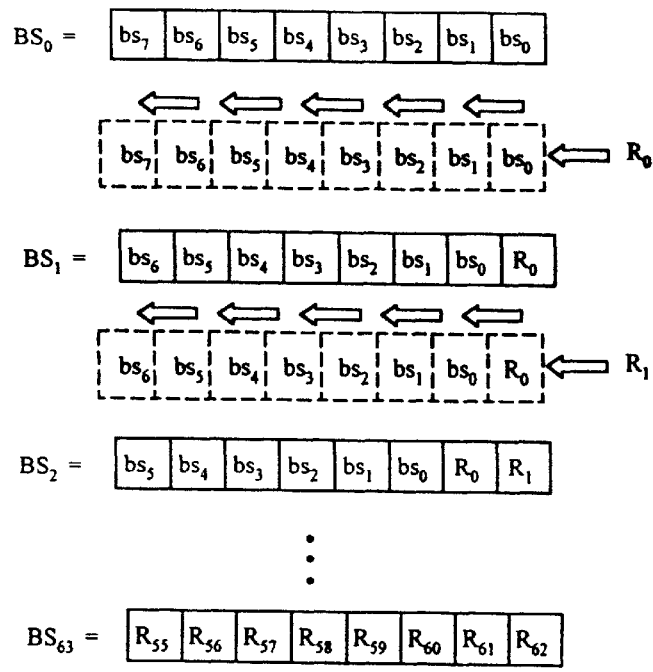
Figure 6A:
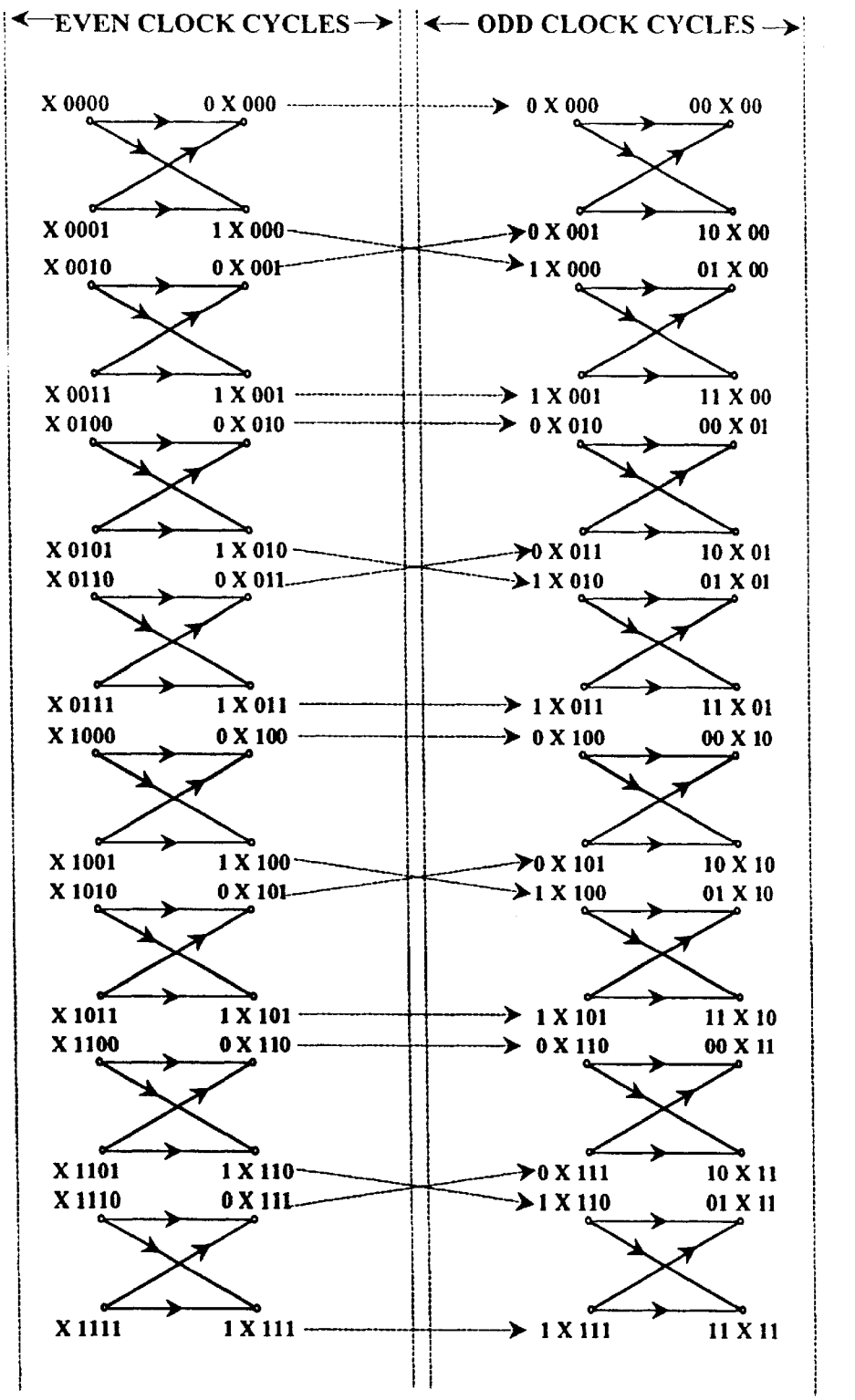
FIGS. 6A, 6B are diagrams depicting an embodiment of the present invention.
Figure 6B:
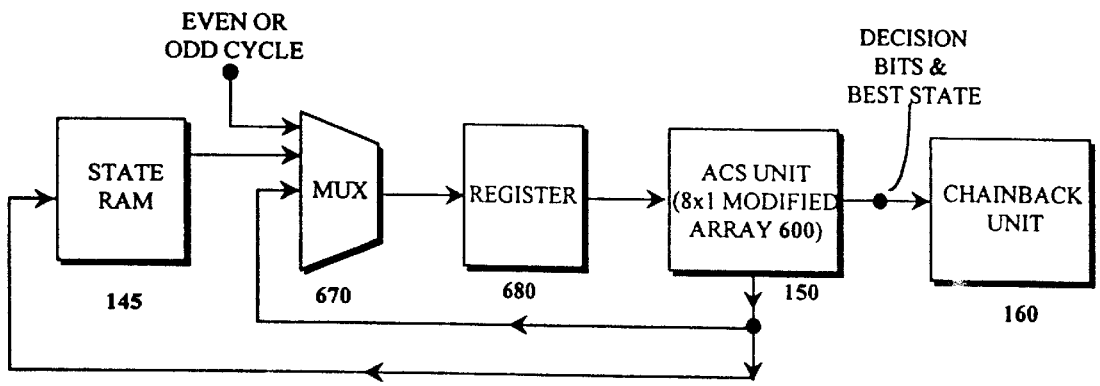

FIGS. 6A, 6B illustrate an embodiment of the present invention. The embodiment makes use of an 8×1 ACS butterfly array 600, incorporating 8 parallel ACS butterfly 155 units to provide an 8× improvement in processing speed. Unlike other attempts to achieve such improvement, butterfly array 600 functions over different clock cycles to reduce memory bandwidth requirements while limiting the number of calculations per clock cycle.

Referring to FIG. 6A, butterfly array 600 uses all 8 butterfly 155 units, during an even clock cycle, to read the new 16 source states as identified by the 4 bit counter X. Butterfly array 600 then calculates the 16 corresponding target state metrics $tm_{0X}$, $tm_{1X}$ for the current level of the trellis. After the even clock cycle (i.e., during an odd clock cycle), butterfly array 600 uses the even cycle target states as the odd source states for the next trellis level. As such, butterfly array 600 adopts the values of the even cycle target state metrics $tm_{0X}$, $tm_{1X}$ as the odd source states metric values $sm_{X0}$, $sm_{X0}$. Butterfly array 600 then computes the odd target state metrics $tm_{0X}$, $tm_{1X}$ in accordance with metric values $sm_{X0}$, $sm_{X0}$ for the corresponding trellis level.

Thus, the 8×1 modified ACS butterfly array 600, as depicted in FIG. 6A, requires 32 clock cycles to completely process two sets of received symbols generated by a K=9 encoder. During even clock cycles, butterfly array 600 reads the new 16 source states identified by the incremented 4 bit counter X and calculates the 16 corresponding target state metrics $tm_{0X}$, $tm_{1X}$ for the first set of received symbols. For odd clock cycles, butterfly array 600 uses the even cycle target states as the new source states and computes the odd target state metrics $tm_{0X}$, $tm_{1X}$ for the second set of received symbols. As such, butterfly array 600 only performs one level of ACS per clock cycle, thereby overcoming the single clock cycle multi-level ACS calculation problems of the 4×2 butterfly array 400.

FIG. 6B illustrates the Viterbi decoder circuitry 650 to support the 8×1 modified ACS butterfly array 600 shown in FIG. 6A. The source state metrics $sm_{X0}$, $sm_{X1}$ for all states are stored in the state RAM 145. By way of illustration, the operation of the Viterbi decoder circuitry 650 will be described by beginning with reading from the state RAM 145 during the even clock cycles. Artisans of ordinary skill will readily appreciate that this embodiment may equally be described by beginning with reading from state RAM 145 during odd clock cycles. Similarly, all reading operations may be performed during odd cycles and all writing operations may be performed during even cycles, or vice-versa.

As such, during even clock cycles, multiplexer MUX 670 is configured to select the source state metric information for 16 sequential states from RAM 145 corresponding to the first set of received code symbols. The source state information is directly supplied to the ACS unit 150, which includes the 8×1 ACS butterfly array 600. Butterfly array 600 then calculates the corresponding 16 target state metrics $tm_{0X}$, $tm_{1X}$, which is fed back to the state RAM 145 and MUX 670. The calculated target state information is then supplied to a register 680 for temporarily storing the target state information. By temporarily storing the target state information in register 680, butterfly array 600 circumvents storing the state information back into memory, thereby ameliorating the memory bandwidth issues of the 8×1 ACS butterfly array 300.

During odd clock cycles, multiplexer MUX 670 selects the target state 20 metric information calculated in the previous clock cycle, which is latched in register 680. This target state metric information is then used by the 8×1 ACS butterfly array 600 as new source state metrics $sm_{X0}$, $sm_{X1}$. Butterfly array 600 subsequently processes the source state metric information to generate the target metric information corresponding to the second set of set of received code symbols. The target metric information is then stored in the state memory RAM 145, which will be used as source state metrics for the following iteration. For the first and second set of received code symbols, this process is repeated for 32 clock cycles to generate 256 decision bits for each of the two sets of received symbols. After the 32 clock cycles, the Viterbi decoder circuitry 650 initiates this entire process with the next two sets of received code symbols.

The Viterbi decoder circuitry 650 also improves the performance of the chainback operation by reducing the number of reads required to generate the decoded decision bits. As stated above, the chainback unit 160 is responsible for storing the decision bits generated by the ACS array. Furthermore, after two clock cycles (i.e., an even and odd clock cycle), the 8×1 modified ACS butterfly array 600 generates 32 decision bits. The Viterbi decoder circuitry 650 enables these 32 decision bits to be stored in a single 32-bit memory word, and thus, the decision bits generated during the even and odd clock cycles are stored in the same memory word.

Therefore, as stated above with respect to chainback operations, the best state is first used to identify the state with the lowest metric from the last process cycle (i.e., best state decision bit value), in order to establish a starting point for chaining backward in time. Since there are 32 bits per memory word, there exists 16 words per process cycle (due to 2 sets of received code symbols), and each of the 32-bit memory words has a unique 8-bit address. One embodiment uses 4 bits of the best state address to select which memory word to read, while the other 4 bits of the best state address determine which of the 16 bits in the 32-bit memory word to read. In particular, if best state $BS_0$ has the 8-bit address: ($bs_7$, $bs_6$, $bs_5$, $bs_4$, $bs_3$, $bs_2$, $bs_1$, $bs_0$), the embodiment chooses bits: ($bs_5$, $bs_4$, $bs_3$, $bs_2$) to select a specific memory word within the memory block $B_0$ and relies on bits: ($bs_7$, $bs_6$, $bs_1$, $bs_0$) to select the best state decision bit $R_0$. The new best state address $BS_1$, is formed by left shifting the best state decision bit $R_0$ into the $BS_0$ LSB: ($bs_6$, $bs_5$, $bs_4$, $bs_3$, $bs_2$, $bs_1$, $bs_0$, $R_0$).

Because the ACS calculations operate on two sets of received symbols, the source states leading to the target state for the just-read decision bit, have, in turn, their decision bits stored within the same 32-bit memory word. Thus, the embodiment chooses bits: ($bs_6$, $bs_1$, $bs_0$, $R_0$) to select the next best state decision bit $R_1$ out of the other half of the 32-bit memory word. Therefore, the best state decision bit is selected from half the bits in the 32-bit memory word, wherein that selected bit helps determine which decision bit in the other half of the 32-bit memory word is the next best state decision bit. By doing so, the number of reads required to correctly chain back the desired path and generate the decoded decision bits is reduced by a factor of 2. Thus, for a chainback unit 160 having a path memory depth of P=64 memory blocks, only 32 reads are required.

The foregoing description of preferred embodiments of the present invention provides illustration and description, but is not intended to be exhaustive or to limit the invention to the precise form disclosed. Modifications and variations are possible consistent with the above teachings or maybe acquired from practice of the invention. For example, the architecture of the embodiments disclosed herein can easily be extended to a 16×1 array or 32×1 array, where 32 or 64 states can be generated per clock cycle. Additionally, instead of operating on two sets of received symbols, the embodiments can be adapted to operate on several sets of received symbols. Thus, it is noted that the scope of the invention is defined by the claims and their equivalents.

What is claimed is:

1. A method of performing an add-compare-select butterfly operation for a Viterbi algorithm implementation, said method comprising:

reading, during even clock cycles, a plurality of source state metrics from a first storage element corresponding to a first set of received symbols;

calculating a target state metric for each of said source state metrics;

temporarily storing said target state metrics into a second storage element;

determining which one of said target state metric contains a lowest value;

storing a predetermined logic bit corresponding to said lowest value target state metric in a third storage element;

reading, during odd clock cycles, said target state metrics from said second storage element and using said read target state metrics as a plurality of intermediate source states metrics corresponding to a second set of received symbols;

calculating an intermediate target state metric for each of said intermediate source states metrics;

determining which one of said intermediate target state metric contains a lowest value;

storing a predetermined logic bit corresponding to said lowest value intermediate target state metric in said third storage element.

2. The method of claim 1, wherein said first and second set of received symbols are encoded using a constraint length of K.

3. The method of claim 2, wherein said add-compare-select butterfly operation is performed until each $2^{K-1}$ target state is visited for each of said first and second set of received symbols.

4. The method of claim 3, wherein said add-compare-select butterfly operation is performed by an 8×1 add-compare-select butterfly structure.

5. The method of claim 4, wherein said a plurality of source state metrics consists of metrics for a set of 16 consecutive source states, said set of 16 consecutive source states being sequentially selected during increasing even clock cycles.

6. The method of claim 5, wherein said calculating said target state metrics includes, adding said source state metrics to a branch metric corresponding to each of two possible transitions, comparing each of the sums of said source state metrics and branch metrics, and selecting and designating the smallest sum and as the target state metric.

7. The method of claim 6, wherein said calculating said intermediate target state metrics includes, adding said intermediate source state metrics to a branch metric corresponding to each of two possible transitions, comparing each of the sums of said intermediate source state metrics and branch metrics, and selecting the smallest sum and designating it as the intermediate target state metric.

8. The method of claim 7, wherein said add-compare-select butterfly operation is used to decode convolutionally-encoded data.

9. The method of claim 8, wherein said third storage element is provided in a chainback memory unit containing a plurality of memory blocks, each of said memory blocks containing said predetermined logic bit for each of said even and odd clock cycles.

10. The method of claim 8, further including a chainback operation for generating a plurality of decoded bit values.

11. The method of claim 10, wherein said chainback operation includes, identifying for the most recent of said memory blocks in said chainback memory unit, said predetermined logical bit having the lowest value;

associating said lowest value logical bit with a specific address;

reading said predetermined logical bit; and transferring the value of said lowest value logical bit into the least significant bit of said specific address and shifting all values within said specific address by one bit position to the left to ascertain a next specific address corresponding to a next memory block in said chainback memory unit.

12. A system for performing an add-compare-select butterfly operation for a Viterbi algorithm implementation, said system comprising:

a first memory element for storing a plurality of source state metrics;

a multiplexer coupled to said first memory element for selecting a first operating path during even clock cycles and for selecting a second operating path during odd clock cycles;

a second storage element, coupled to said multiplexer, for temporarily storing target state metrics;

an add-compare-select mechanism, coupled to said second storage element and said multiplexer, for calculating a calculated target state metric for each of said source state metrics; and a third storage element for storing a predetermined logic bit corresponding to a calculated target state metric having the lowest value, wherein said multiplexer selects said first operating path during even clock cycles and supplies said source state metrics from said first memory element to said add-compare-select mechanism to generate target state metrics corresponding to a first set of received symbols, and wherein said multiplexer selects said second operating path during odd clock cycles to read said target state metrics from said second memory element and use said read target state metrics as intermediate source state metrics in order for said add-compare-select mechanism to generate intermediate target state metrics based on said intermediate source state metrics corresponding to a second set of received symbols.

13. The system of claim 12, wherein said first and second set of received symbols are encoded using a constraint length of K.

14. The system of claim 13, wherein said add-compare-select butterfly operation is performed until each $2^{K-1}$ target state is visited for each of said first and second set of received symbols.

15. The system of claim 14, wherein said add-compare-select butterfly operation is performed by an 8×1 add-compare-select butterfly structure.

16. The system of claim 15, wherein said a plurality of source state metrics consists of metrics for a set of 16 consecutive source states, said set of 16 consecutive source states being sequentially selected during increasing even clock cycles.

17. The system of claim 12, wherein said add-compare-select mechanism performs said add-compare-select operation by adding said source state metrics to a branch metric corresponding to each of two possible transitions, comparing each of the sums of said source state metrics and branch metrics, and selecting the smallest sum and designating it as the target state metric.

18. The system of claim 17, wherein said add-compare-select butterfly operation is used to decode convolutionally-encoded data.

19. The system of claim 18, wherein said third storage element is provided in a chainback memory unit containing a plurality of memory blocks, each of said memory blocks containing said predetermined logic bit for each of said even and odd clock cycles.

20. The system of claim 19, wherein said chainback memory unit generates a plurality of decoded bit values.

21. The system of claim 20, wherein said chainback memory unit identifies said predetermined logical bit having the lowest value for the most recent of said memory blocks, associates said lowest value logical bit with a specific address, reads said predetermined logical bit, and transfers the value of said lowest value logical bit into the least significant bit of said specific address and shifts all values within said specific address by one bit position to the left in order to ascertain a next specific address corresponding to a next memory block within said chainback memory unit.

* * * * *